United States Patent [19]
Fritz et al.

[11] Patent Number: 5,780,867
[45] Date of Patent: Jul. 14, 1998

[54] BROADBAND LIGHT-EMITTING DIODE

[75] Inventors: Ian J. Fritz, Albuquerque; John F. Klem, Sandia Park; Michael J. Hafich, Albuquerque, all of N. Mex.

[73] Assignee: Sandia Corporation, Albuquerque, N. Mex.

[21] Appl. No.: 612,361

[22] Filed: Mar. 7, 1996

[51] Int. Cl.$^6$ ............................ H01L 33/00; H01L 29/15
[52] U.S. Cl. ............................. 257/13; 257/18; 257/97
[58] Field of Search ................................. 257/13, 18, 94, 257/96–97

[56] References Cited

U.S. PATENT DOCUMENTS

| | | | |
|---|---|---|---|
| 4,313,125 | 1/1982 | Hartman et al. | 257/96 |
| 5,117,469 | 5/1992 | Cheung et al. | 257/18 |
| 5,126,803 | 6/1992 | Hager | 257/94 |
| 5,138,624 | 8/1992 | Hong | 372/45 |
| 5,166,761 | 11/1992 | Olson | 257/46 |
| 5,521,935 | 5/1996 | Irikawa | 257/18 |

OTHER PUBLICATIONS

A.J. Moseley, D.J. Robbins, C. Meaton, R. M. Ash, R. Nicklin, P. Bromley, R. R. Bradley, A. C. Carter, C. S. Hong, and L. Figueroa, "Broadband GaAs/Al$_x$Ga$_{1-x}$As Multi-Quantum Well LED," *Quantum Optoelectronics, Optical Society of America Technical Digest Series*, vol. 7, pp. 193–196 (OSA, Washington, DC, 1991).

S. Kondo, H. Yasaka, Y. Noguchi, K. Magari, M. Sugo, and O. Mikami, "Very Wide Spectrum Multiquantum Well Superluminescent Diode at 1.5 μm," *Electronics Letters*, vol. 28, pp. 132–133, 16 Jan. 1992.

X. Wang, D. E. Vaughan, and V. Pelekhaty, "A Novel Miniature Spectrometer Using an Integrated Acousto–Optic Tunable Filter," *Review of Scientific Instruments*, vol. 65, pp. 3653–3656, Dec. 1994.

I. J. Fritz, J. F. Klem, M. J. Hafich and A. J. Howard, "Broadband Light Emitting Diodes from Pseudo–Alloy Quantum Wells," *Electronics Letters*, vol. 31, pp. 829–830, 11 May 1995.

I. J. Fritz, J. F. Klem, M. J. Hafich and A. J. Howard, "Novel Pseudoalloy Approach to Epitaxial Growth of Complex InGaAlAs Multilayer Structures," *Applied Physics Letters*, vol. 66, pp. 2825–2827, 22 May 1995.

I. J. Fritz, J. F. Klem, M. J. Hafich, A. J. Howard, and H. P. Hjalmarson, "Broad–Band Light–Emitting Diode for 1.4–2.0 μm Using Variable–Composition InGaAs Quantum Wells," *IEEE Photonics Technology Letters*, vol. 7, pp. 1270–1272, Nov. 1995.

*Primary Examiner*—Jerome Jackson
*Assistant Examiner*—John Guay
*Attorney, Agent, or Firm*—John P. Hohimer

[57] ABSTRACT

A broadband light-emitting diode. The broadband light-emitting diode (LED) comprises a plurality of III–V compound semiconductor layers grown on a semiconductor substrate, with the semiconductor layers including a pair of cladding layers sandwiched about a strained-quantum-well active region having a plurality of different energy bandgaps for generating light in a wavelength range of about 1.3–2 μm. In one embodiment of the present invention, the active region may comprise a first-grown quantum-well layer and a last-grown quantum-well layer that are oppositely strained; whereas in another embodiment of the invention, the active region is formed from a short-period superlattice structure (i.e. a pseudo alloy) comprising alternating thin layers of InGaAs and InGaAlAs. The use a short-period superlattice structure for the active region allows different layers within the active region to be simply and accurately grown by repetitively opening and closing one or more shutters in an MBE growth apparatus to repetitively switch between different growth states therein. The broadband LED may be formed as either a surface-emitting LED or as an edge-emitting LED for use in applications such as chemical sensing, fiber optic gyroscopes, wavelength-division-multiplexed (WDM) fiber-optic data links, and WDM fiber-optic sensor networks for automobiles and aircraft.

53 Claims, 8 Drawing Sheets

BROADBAND LIGHT-EMITTING DIODE

This invention was made with Government support under Contract No. DE-AC0494AL85000 awarded by the U.S. Department of Energy. The Government has certain rights in the invention.

FIELD OF THE INVENTION

The present invention relates in general to semiconductor light sources, and in particular to a broadband light-emitting diode for generating light in a wavelength range of about 1.3 to 2 μm.

BACKGROUND OF THE INVENTION

Broadband light-emitting diodes (LEDs) have applications as light sources for many different types of applications including chemical sensing, fiber optic gyroscopes, wavelength-division-multiplexed (WDM) fiber-optic data links, and WDM fiber-optic sensor networks for automobiles and aircraft.

For chemical sensing applications including environmental sensing (e.g. process or stack monitoring) or biomedical sensing (e.g. noninvasive blood glucose monitoring for diabetics), a broadband light source emitting in a wavelength range of about 1.3 to 2 μm is particularly useful since this near-infrared wavelength range encompasses absorption bands due to the first overtones of N-H and C-H stretch modes of organic molecules. These absorption bands provide important signature information for detecting the presence and/or concentration of organic compounds in gaseous or liquid samples. Conventional LEDs operating in this wavelength range generally have a bandwidth of about 100 nm or less; and this small bandwidth is insufficient to fulfill the requirements for many chemical sensing applications. A broader bandwidth of light can be generated with lamps having incandescent filament sources; but such lamps are relatively inefficient and short lived compared to LEDs.

An advantage of the broadband light-emitting diode (LED) of the present invention is that a broad bandwidth of light can be generated centered about one or more predetermined wavelengths in the 1.3 to 2 μm wavelength range matched to signature bands of one or more organic compounds to be sensed.

Another advantage is that an emission bandwidth of up to about 400 nm or more can be provided with a broadband LED formed according to the present invention.

A further advantage is that the broadband LED of the present invention can be formed as a surface-emitting device that emits light centered about an optical axis that is substantially perpendicular to a plurality of semiconductor layers in the LED; or as an edge-emitting device that emits light in a direction substantially parallel to (or at an acute angle to) the layers.

These and other advantages of the broadband light-emitting diode of the present invention will become evident to those skilled in the art.

SUMMARY OF THE INVENTION

The present invention comprises a broadband LED having a plurality of III–V compound semiconductor layers epitaxially grown on a substrate, with the semiconductor layers including a pair of cladding layers sandwiched about a strained-quantum-well active region having a plurality of different energy bandgaps. A semiconductor p-n junction is formed within one of the cladding layers proximate to the active region; and electrodes are formed above and below the active region for electrically activating the LED to generate light within a wavelength range of about 1.3–2 μm. A mesa can be formed within the plurality of semiconductor layers for defining an active area of the active region wherein the light is generated.

According to some embodiments of the present invention, a plurality of strained quantum-well layers forming the active region can be grown with a first-grown quantum-well layer being strained in an opposite sense from a last-grown quantum-well layer to provide a degree of strain compensation within the active region. According to other embodiments of the present invention, the active region can comprise a short-period superlattice structure with a plurality of quantum-well layers and intervening barrier layers in the active region having opposite strains (e.g. compressively-strained quantum-well layers and tensile-strained barrier layers). Furthermore, embodiments of the invention can be provided as surface-emitting LEDs that emit light outward from the active region through one or both cladding layers (i.e. upward or downward emission), and as edge-emitting LEDs that emit light outward from the active region through a sidewall of the semiconductor layers (i.e. side or edge emission).

Advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
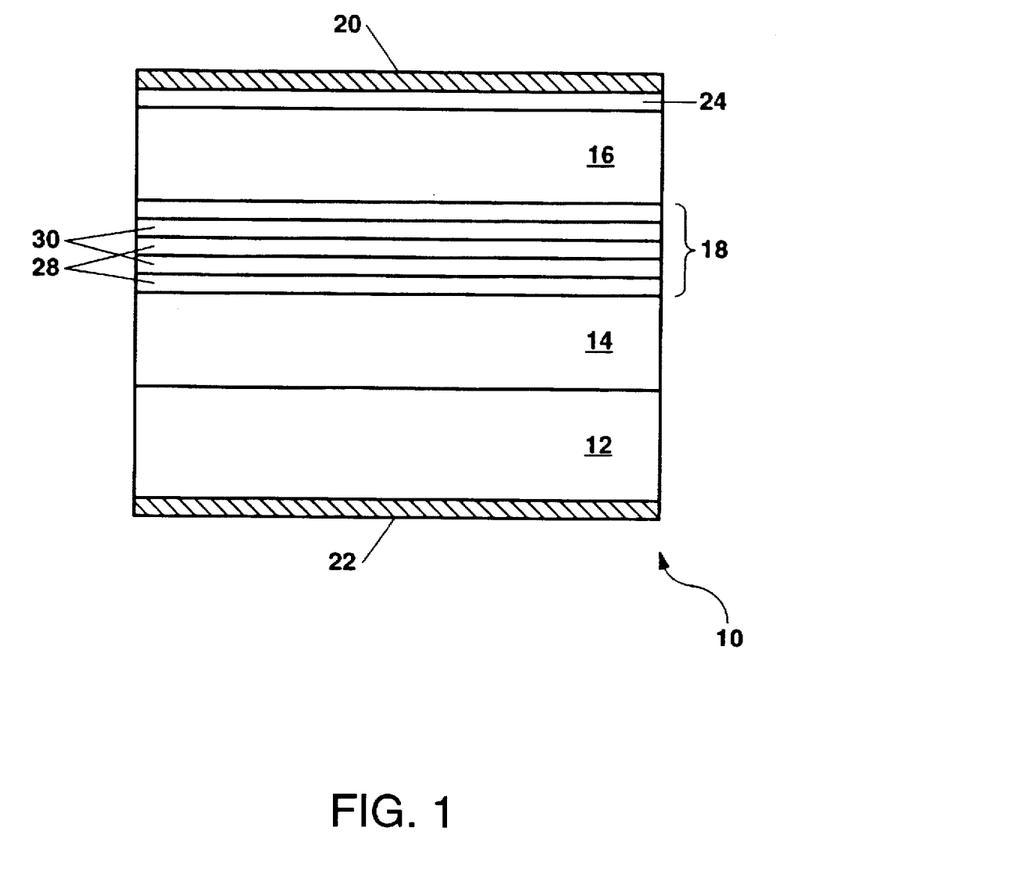
FIG. 1 shows a schematic cross-section view of a first embodiment of a broadband light-emitting diode formed according to the present invention.

Referring to FIG. 1, there is shown a schematic cross-section diagram of a first embodiment of a broadband light-emitting diode (LED) according to the present invention. The broadband LED 10 comprises a substrate 12 having a semiconductor structure epitaxially grown thereon further comprising a plurality of III–V compound semiconductor layers including a pair of cladding layers (i.e. a first cladding layer 14 and a second cladding layer 16) and a strained-quantum-well active region 18 sandwiched between the cladding layers (14 and 16). Electrodes (i.e. an upper electrode 20 and a lower electrode 22) are formed above and below the active region 18 for activating LED 10 and generating light within a wavelength range of about 1.3–2 μm. The semiconductor structure can also include a heavily-doped cap layer 24 grown above the second cladding layer 16 to improve an electrical contact with the upper electrode 20.

The substrate 12 (e.g. InP, InAs, GaSb, AlSb, or InGaAs) can be doped with n-type material (e.g. Si to an impurity dopant concentration of about $1-2 \times 10^{18}$ cm$^{-3}$). The substrate 12 as defined herein can include one or more buffer layers (of a dopant type that has a polarity that is the same as the polarity of the substrate) epitaxially grown thereon for smoothing or conditioning an upper surface of the substrate 12 prior to growth of the first cladding layer 14.

The semiconductor structure comprising a plurality of semiconductor layers can be epitaxially grown on the substrate 12 by metal-organic chemical vapor deposition (MOCVD), molecular beam epitaxy (MBE), or the like for forming the LED 10. In one embodiment of the present invention, wherein the active region 18 comprises a plurality of alternating short-period superlattice layers of two different semiconductor alloy compositions, MBE is generally preferred as a growth method since the short-period superlattice layers can have layer thicknesses of a few monolayers or less.

In the embodiment of the present invention in FIG. 1, the semiconductor layers comprise ternary and quaternary III–V compound semiconductor alloys containing indium (In) and arsenic (As) in combination with one or more of gallium (Ga) and aluminum (Al). For other embodiments of the present invention, any III–V compound semiconductor alloy having a lattice constant within a range of about 0.57–0.63 nm can be used, including IP, InGaAsP, GaAsSb, AlAsSb and AlGaAsSb or the like.

In FIG. 1, the first cladding layer 14 generally has a thickness of about 1–2 μm or more, and is substantially lattice-matched to the substrate 12. Suitable semiconductor alloys for forming the first cladding layer 14 on an InP substrate 12 include InP, InGaAsP (having an alloy composition to provide a bandgap energy of about 1.1 eV or more and a lattice constant of about 0–587 nm), and In$_{0.52}$Al$_{0.48}$As and AlAs$_{0.56}$Sb$_{0.44}$.

The first cladding layer 14 is preferably doped to about the same impurity dopant concentration as the substrate 12. If the substrate 12 is doped n-type, then a semiconductor p-n junction 26 is formed within the first cladding layer 14 near the active region 18, with an n-side of the junction 26 facing the substrate 12 and a p-side of the junction facing the active region 18 (see FIGS. 2 and 5). Alternately, if the substrate 12 is doped p-type then the semiconductor p-n junction 26 is formed within the second cladding layer 16 with the p-side of the junction 26 facing the active region. For embodiments of the present invention wherein the substrate is semi-insulating (e.g. Fe-doped InP), the semiconductor p-n junction 26 can be formed in one or the other of the first and second cladding layers (14 and 16, respectively). Location of the semiconductor p-n junction 26 within one of the cladding layers (14 and 16) near the active region 18 is advantageous in minimizing difficulties in transporting holes through the active region 18 which is generally p-type doped.

As an example, an In$_{0.52}$Al$_{0.48}$As first cladding layer 14 can be formed on an n-type InP substrate 12, with a majority of the first cladding layer 14 doped n-type (e.g. with Si to about $1-2 \times 10^{18}$ cm$^{-3}$) and a thin last-grown portion of the first cladding layer 14 (about 25 nm thick) being doped p-type (e.g. with Be to about $1-2 \times 10^{18}$ cm$^{-3}$) thereby forming a semiconductor p-n junction 26 within the first cladding layer 14 located at a distance, dj, of about 20–30 nm below the active region 18. This location of the p-n junction 26 at a short distance from the active region 18 prevents any substantial depletion of holes from a strained-quantum-well layer 28 in the active region adjacent to the p-n junction.

In FIG. 1, the active region 18 according to the first embodiment of the present invention comprises a plurality of strained-quantum-well (SQW) layers 28 separated by barrier layers 30. (Strained-quantum-well layers are defined herein as being quantum-well layers, a majority of which are strained with lattice constants differing from the lattice constant of the substrate; although in some instances a single one of the strained-quantum-well layers can have a lattice constant that is substantially equal to that of the substrate. Furthermore, a quantum-well layer is defined herein to include any semiconductor layer which provides a quantum confinement of electrons and holes therein by means of one or more quantum-wells, quantum wires or quantum dots.) By growing each of the SQW layers 28 with different amounts of compressive or tensile strain therein (produced by semiconductor alloys generally having a lattice constant differing from that of the substrate by less than about ±1%), considerable latitude is provided for selecting different energy bandgaps for each of the SQW layers 28 without formation of any substantial number of misfit dislocations in any of the layers SQW 28 (or in any overlayers grown above the active region). These different energy bandgaps result in the production of light at different wavelengths in the range of about 1.3–2 μm, thereby forming the broadband light emitted by LED 10.

The entire active region 18 is preferably p-type doped (e.g. to about $5 \times 10^{17}$ cm$^{-3}$ or more with Be) to minimize any difficulties that might otherwise arise due to transport of holes through the barrier layers 30. A uniform distribution of electrons and holes across the plurality of SQW layers 28 in the active region 18 is generally to be preferred in order to generate a uniform emission of light over a broad bandwidth; and this can be provided by a heavy p-type doping across the entire active region 18 so that activation of the LED 10 by a flow of an electrical current through the active region 18 is dominated by electron injection and capture by the large hole concentration within the SQW layers 28. The thickness of the SQW layers 28 can be in the range of about 5 - 20 nm, with individual SQW layers 28 having the same or different thicknesses. By varying the thicknesses of the individual SQW layers 28 during epitaxial growth, relative light emission rates of the different SQW layers 28 can be controlled to define a particular wavelength profile of the light emitted from the broadband LED 10, or to compensate for a non-uniform carrier capture across the SQW layers 28. The barrier layers 30 preferably have a uniform layer thickness that is generally about 5–10 nm.

Figure 2:
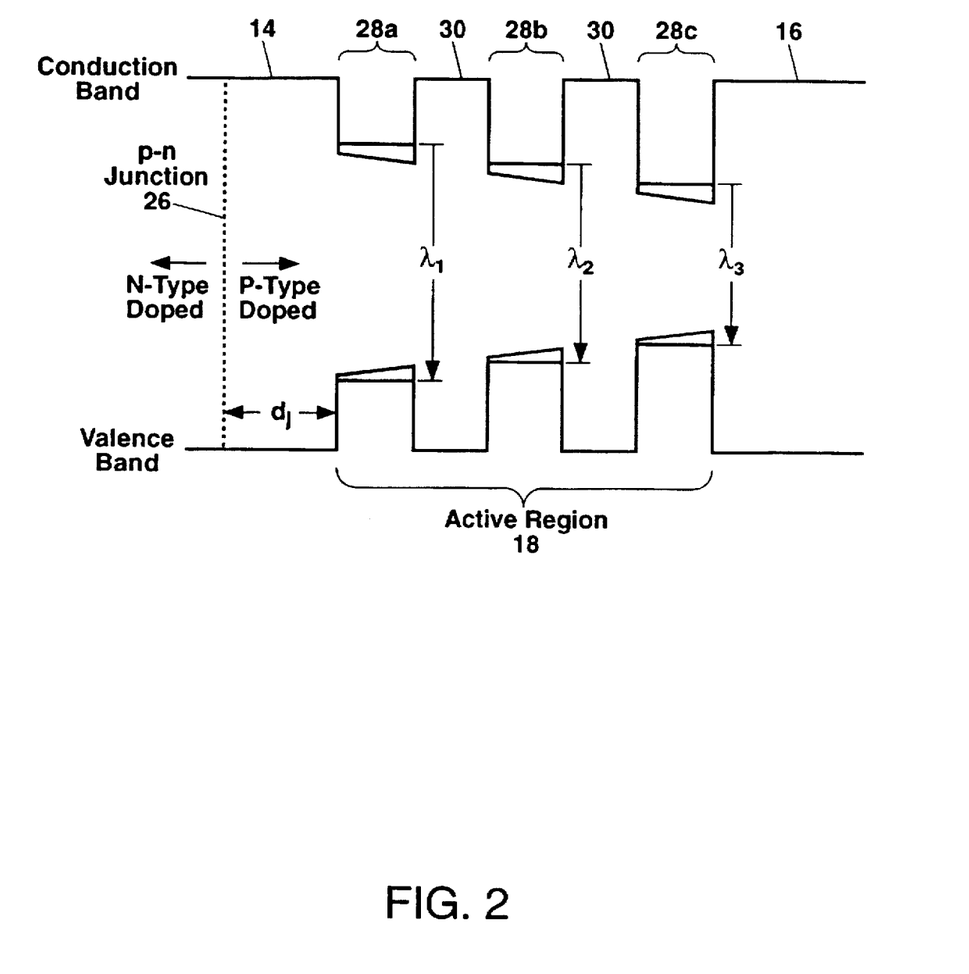
FIG. 2 shows a partial energy band diagram for a first example a strained-quantum-well active region of the broadband LED formed according to the present invention.

FIG. 2 shows a partial energy band diagram for a first example a strained-quantum-well active region 18 of the broadband LED 10 according to the present invention. In the example of FIG. 2, the strained-quantum-well active region 18 comprises three equal-thickness (about 10 nm) SQW layers (28a, 28b and 28c) separated by equal-thickness (about 6 nm) barrier layers 30. A first-grown SQW layer 28a and a last-grown SQW layer 28c in this first example are oppositely strained. If each of the SQW layers 28 are formed from $In_xGa_{1-x}As$, for example, the first-grown SQW layer 28a can have a semiconductor alloy composition with x~0.4 to provide a tensile strain therein (with a lattice constant difference or misfit, $\Delta a$, between the SQW layer 28a and an InP substrate 12 being about −0.9%); the last-grown SQW layer 28c can have a different alloy composition with x~0.66 to provide a compressive strain therein (with $\Delta a$~+0.9%); and the SQW layer 28b can have yet another semiconductor alloy composition with x~0.53 so that it is substantially lattice-matched to the InP substrate with $\Delta a$~0%. (Although a bandgap wavelength for light emission from each SQW layer 28 generally can be determined by either the composition or thickness of that layer, according to the present invention the composition is preferably used for defining or adjusting the bandgap wavelength during epitaxial growth, while the layer thickness is preferably used during growth for adjusting an emission intensity of the light.) For this first example of the present invention in FIG. 2, the barrier layers 30 can be formed of $In_{0.52}Al_{0.48}As$ so that they are substantially unstrained (i.e. lattice matched with the InP substrate 12) with an energy bandgap that is larger than the energy bandgap of any of the SQW layers 28.

One way of growing an active region 18 having differing semiconductor alloy compositions in each of the SQW layers 28 using an MBE growth method is to continuously or step-wise ramp an effusion cell temperature (e.g. the temperature of a Ga effusion cell of an MBE apparatus) from a first predetermined temperature to a second predetermined temperature, thereby changing the semiconductor alloy composition during growth. Thus, a predetermined profile for the temperature ramp can be selected to provide predetermined semiconductor alloy compositions for each of a number, n, of SQW layers 28 thereby defining a plurality of bandgap energies for light emission at different bandgap wavelengths $\lambda_1, \lambda_2 \ldots \lambda_n$ within the range of about 1.3–2 µm. The SWQ layer having the largest bandgap energy with light emission centered about wavelength $\lambda_1$ is preferably SQW layer 28a located nearest the p-n junction 26 as shown in FIG. 2.

Figure 6:
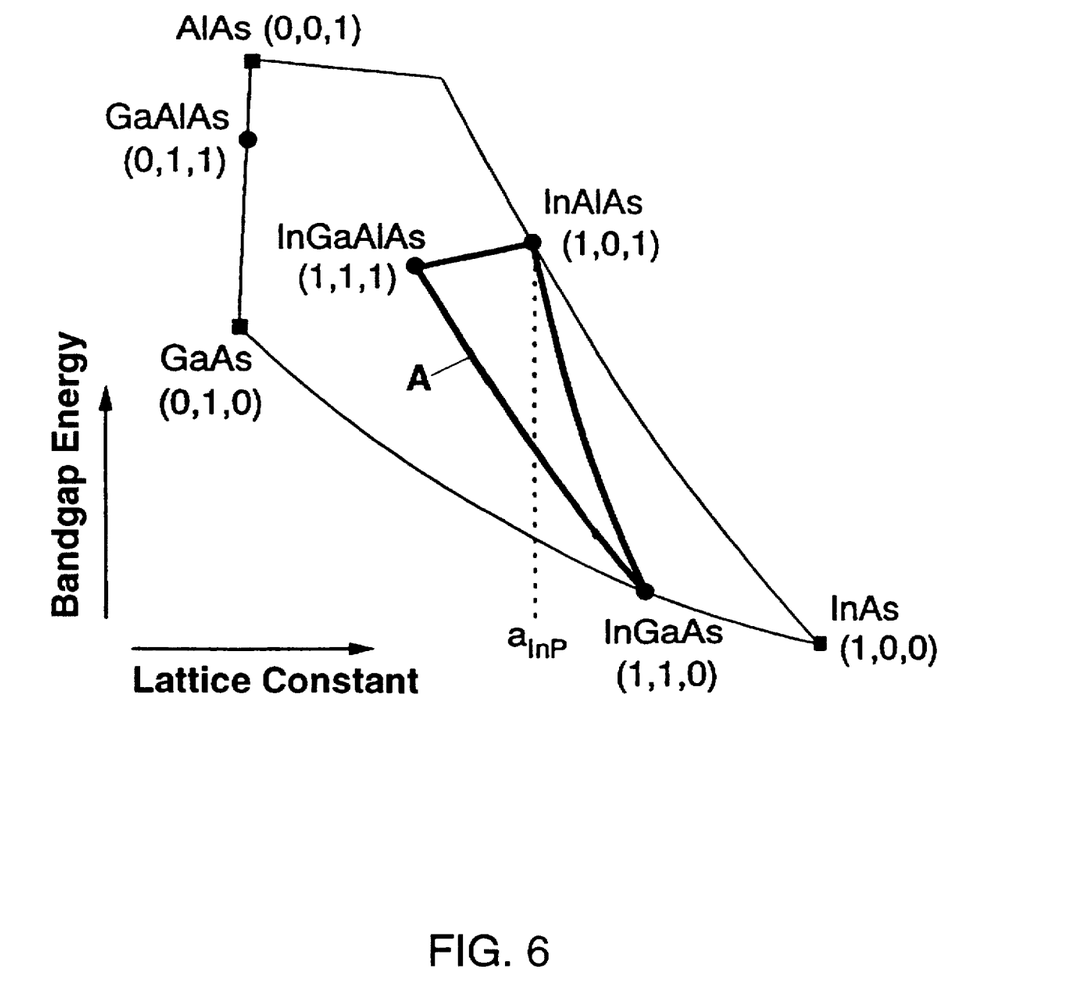
FIG. 6 shows an energy bandgap versus lattice constant diagram for illustrating formation of the second example of the strained-quantum-well active region of FIG. 5

Although the active region 18 includes a plurality of SQW layers 28 therein, it is preferred that the active region 18 taken as a whole be strain compensated (i.e. substantially strain balanced) by balancing the tensile strain in one or more of the SQW layers 28 with substantially equal but opposite compressive strain in other of the SQW layers 28. In this way, the active region 18 can be grown with an average lattice constant that is substantially matched to the lattice constant of the substrate 12 (e.g. a lattice constant, $a_{InP}$, for an InP substrate 12 as shown in FIG. 6). (An average lattice constant of the active region is defined herein as an average over all the layers forming the active region, and is obtained by taking a sum of the product of the lattice constant of each layer therein times the fraction of the total active layer thickness occupied by that layer.)

The active region 18 in the first example of FIG. 2 can further include a separate-confinement layer 36 (see FIG. 5) on each side of the active region 18 and in contact with the cladding layers (14 and 16). Each separate-confinement layer 36 can have a uniform or graded semiconductor alloy composition to provide an bandgap energy intermediate between that of the cladding and strained-quantum-well layers (and preferably between that of the cladding and barrier layers) for confining carriers (i.e. electrons and holes) to promote more efficient recombination within the active region 18. The provision of a uniform-composition separate-confinement layer 36 within the active region forms a separate-confinement-heterostructure (SCH) active region 18; whereas the provision of a composition-graded separate-confinement layer 36 (i.e. graded from a higher-bandgap to a lower-bandgap alloy composition for a first-grown separate-confinement layer, and graded from a lower-bandgap to a higher-bandgap alloy composition for a last-grown separate-confinement layer) forms a graded-index separate-confinement-heterostructure (GRIN-SCH) active region 18.

Returning to the first embodiment of the present invention in FIG. 1, a second cladding layer 16 can be epitaxially grown above the active region 18 with a layer thickness that is about 0.4–1 µm or more. The second cladding layer 16 generally comprises the same semiconductor alloy used for forming the first cladding layer 14; but with a dopant polarity that, for the most part, is opposite that of the first cladding layer 14. (Recall that depending on the polarity of the substrate, the semiconductor p-n junction 26 can be located either in the first cladding layer 14 or in the second cladding layer 16.)

A thin cap layer 24 (about 20–100 nm thick) can be grown above the second cladding layer 16 to aid in contacting the LED 10 with a deposited upper electrode 20. The cap layer 24 can be heavily doped (to about $2 \times 10^{18}$ cm$^{-3}$ or more) with a dopant type that is the same as that of the underlying second cladding layer 16. For example, for an n-type substrate 12, the second cladding layer 16 and cap layer 24 are p-type doped (e.g. with Be). The cap layer 24 generally comprises a low-bandgap semiconductor material such as InGaAs or the like that is substantially lattice matched to the substrate.

Figure 3:
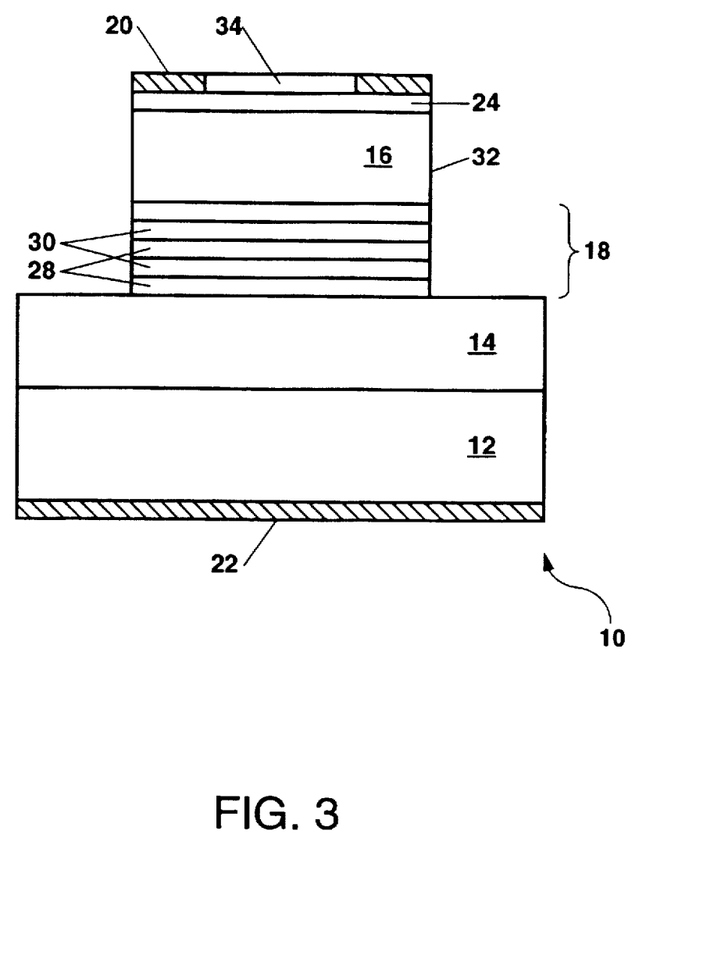
FIG. 3 shows a schematic cross-section view of a second embodiment of a broadband light-emitting diode formed according to the present invention.

In FIG. 1, the upper and lower electrodes (20 and 22, respectively) can comprise any electrode metallizations known to the art for contacting InP, InGaAs or the like. For example, for an n-type InP substrate 12 the upper electrode 20 can comprise a deposited Ti/Pt/Au metallization having an overall thickness of about 200 nm; and the lower electrode 22 can comprise a deposited Ge/Au/Ni/Au metallization having a similar thickness. One or both of the electrodes 20 and 22 can be patterned depending upon a particular type of broadband LED 10 to be formed. For example, to form an edge-emitting LED 10 for emitting light in a direction substantially parallel to the epitaxial layers (i.e. through a sidewall of the plurality of semiconductor layers forming the semiconductor structure, or through a sidewall of a mesa formed within the layers), the lower electrode 22 in FIG. 1 is generally a full-surface electrode, and the upper electrode 20 can be patterned to form a stripe having a width of about 2–100 µm or more. As another example, an edge-emitting LED 10 can be formed by etching downward through the plurality of semiconductor layers of the structure to form a mesa 32 of predetermined dimensions (with the mesa 32 defining an active area of the active region 18 for light generation therein), with a full-surface or patterned upper electrode 20 provided above the mesa 32. As yet another example, a surface-emitting LED 10 for emitting light in an upward and/or downward direction (i.e. through at least one of the cladding layers 14 and 16) can be formed by providing a mesa 32 in the plurality of semiconductor layers as shown in FIG. 3 with an annular upper electrode 20 having an aperture 34 formed therethrough for an upward emission of the light. (Since an InP substrate 12 is substantially transparent to light within the wavelength range of about 1.3–2 µm, a downward-emitting LED can also be formed according to the present invention by providing a patterned lower electrode 22 on the InP substrate 12 with an aperture formed therethrough, or alternately by providing a semi-transparent lower electrode 22 formed of indium-tin oxide or the like.) For edge-emitting LED embodiments of the present invention, a particular concern is that of preventing reflective feedback from edges or sidewalls of the semiconductor structure from causing lasing action within the LED 10, especially at high injection current levels. Such lasing action results in a narrowing of the emission spectrum which is generally undesirable for a broadband LED. Many methods are known to the art for preventing lasing in conventional edge-emitting LEDs; and such methods are also applicable to edge-emitting embodiments of the broadband LED 10 of the present invention. These methods include limiting lateral dimensions of the broadband LED 10 so that insufficient gain is available for lasing; anti-reflection coating one or both edges (i.e. end facets) of the broadband LED 10 to reduce reflective feedback; patterning an electrode (20 or 22) of the broadband LED 10 to leave an unpumped region in the LED to absorb a portion of the generated light and thereby reduce the gain therein; and forming the broadband LED 10 with a patterned stripe electrode 20 having an orientation that is not perpendicular to any end facet of the LED so that reflective feedback is reduced.

FIG. 3 shows a schematic cross-section view of another embodiment of a broadband LED 10 formed according to the present invention. This second embodiment of the invention is similar to the first embodiment of the invention in FIG. 1 except for having a mesa 32 formed within the plurality of semiconductor layers of the semiconductor structure by etching downward at least part way through the layers. The mesa 32 with generally vertical sidewalls can be rectangular, square, circular or otherwise shaped depending upon a particular type of broadband LED 10 to be formed according to the present invention.

For example, to form a surface-emitting LED 10, the mesa 32 can be square or circular in shape with lateral dimensions of up to about 1 mm or more. For light emission in an upward direction through the second cladding layer 16, the upper electrode 20 can be patterned with an annular shape having an aperture 34 formed therein as shown in FIG. 3. Alternately, the upper electrode 20 can be a semi-transparent electrode formed from indium-tin oxide or the like. As another example, an edge-emitting LED 10 can be formed by providing a mesa 32 in the form of a rectangular stripe, generally with opaque electrodes 20 and 22. Still another example of a broadband LED 10 according to the present invention can be formed to provide light emission in both an upward (or downward) direction as well as in a lateral direction along the layers (or at an acute angle thereto). This is possible since the SQW layers 28 emit light in different directions, with a spatial profile and a polarization of the emitted light depending upon particular quantum level transitions within the SQW layers 28.

Figure 4:
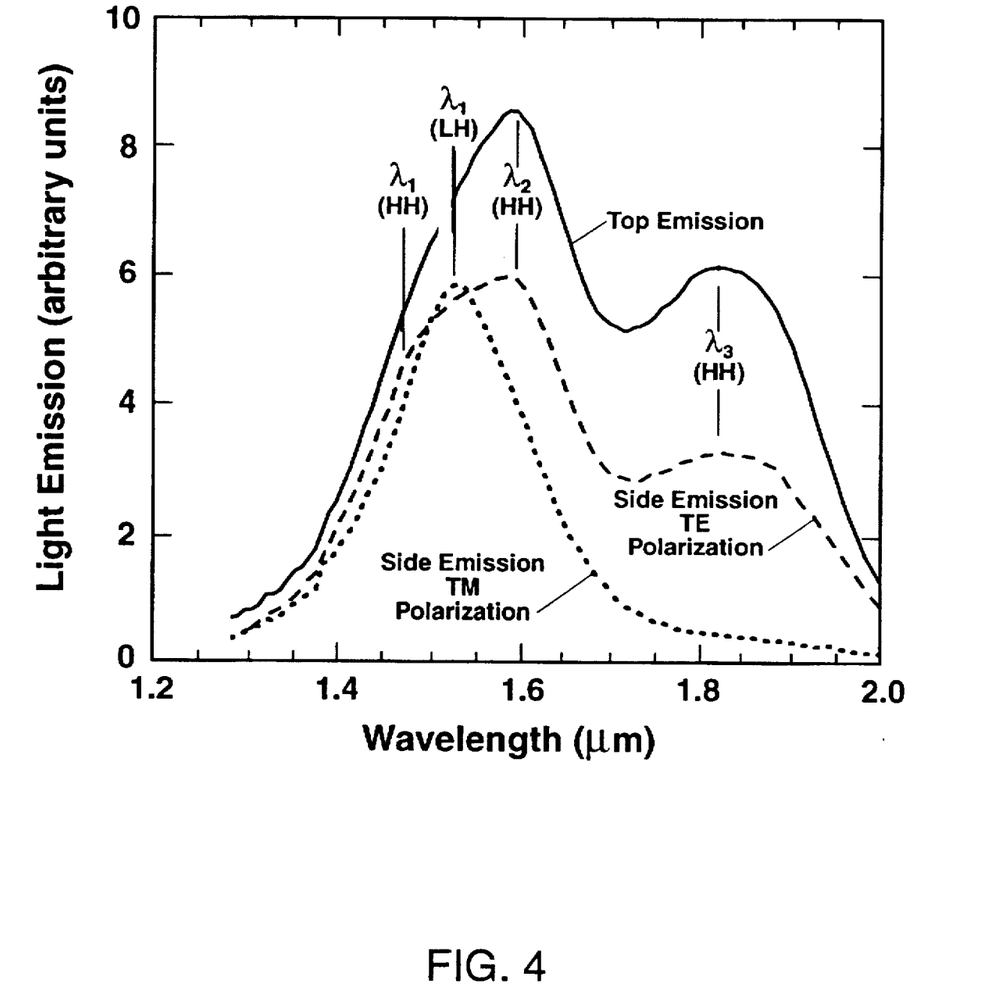
FIG. 4 shows emission spectra for light emitted from a broadband LED having a strained-quantum-well active region formed according to the first example of FIG. 2.

FIG. 4 shows normalized spectral curves of the light emission from the top and side of a broadband LED 10 formed according to the second embodiment of the present invention with an active region 18 formed according to the first example in FIG. 2. These spectra were obtained for direct-current (dc) forward-biased operation of a broadband LED 10 having a square-shaped mesa 32 of width 1.5 mm at an injection current of 500 mA. A 0.25-meter spectrometer and a liquid-nitrogen-cooled InAs photodetector were used to record raw spectra which were normalized using a calibrated tungsten-halogen lamp. In FIG. 4, the broadband light emission in the range of about 1.3–2 µm is produced by carriers (i.e. electrons and holes generated by the injection current) that recombine in the different SQW layers 28 and emit light at different bandgap wavelengths, $\lambda_1$, $\lambda_2$ and $\lambda_3$. In FIG. 4, the top emission is substantially unpolarized while the side or edge emission has a transverse electric (TE) polarization component (shown as a dashed line) due to heavy-hole (HH) transitions and a transverse magnetic (TM) polarization component (shown as a dotted line) due to a light-hole (LH) transition in a tensile-strained SQW layer 28a. These polarization components are easily separated by a polarization analyzer placed in front of a spectrometer used to measure the emission spectra.

Also shown in FIG. 4 as vertical lines are calculated wavelengths for the heavy-hole and light-hole transitions within the various SQW layers 28 using a tunneling resonance calculation in a two-band envelope-function formalism. The bandgap wavelength, $\lambda_1$, of a tensile-strained SQW layer 28a is split into two components due to a valence band splitting therein, allowing both heavy-hole and light-hole transitions between excitonic states in conduction and valence bands of the SQW layer 28a; whereas SQW layers 28b and 28c, not being tensile strained, have only heavy-hole transitions. (Light emission in the TM polarization state is due principally to the light-hole transition, since to a good approximation, light emission with TM polarization is forbidden for heavy-hole transitions.) In the example of FIG. 4, the calculated emission wavelengths are 1.38 µm for the heavy-hole component of $\lambda_1$; 1.445 µm for the light-hole component of $\lambda_1$; 1.55 µm for $\lambda_2$; and 1.765 µm for $\lambda_3$. The observed light emission in FIG. 4 has peaks or features that are at slightly longer wavelengths than the calculated transitions, but is generally in good agreement with the calculations. Similar emission spectra were observed for other broadband LEDs 10 formed according to the present invention with smaller mesa dimensions and operated at about the same injection current level.

For the conditions of FIG. 4, a total light emission is estimated to be about 250 µW through the aperture 34 in the upper electrode 20. It is expected that the broadband light emission for surface-emitting LEDs 10 formed according to the present invention can be further increased by incorporating one or more mirrors (not shown) into the LED 10 to reflect the generated broadband light into a preferred direction of emission (e.g. upward or downward). Such a mirror may be formed, for example, by a non-annealed electrode (20 or 22); or alternately, by a plurality of pairs of alternating high-refractive-index and low-refractive-index layers deposited on an upper surface of the LED 10 after growth, or epitaxially grown as a part of the plurality of semiconductor layers comprising the semiconductor structure. The alternating high- and low-refractive-index layers form a distributed Bragg reflector (DBR) mirror with a high reflectivity of up to 90% or more over a predetermined wavelength range.

As examples, a semiconductor DBR mirror may be grown below the first cladding layer 14 for reflecting the generated light upward, or a dielectric DBR mirror may be deposited above the upper electrode 20 for reflecting the light downwards through a transparent InP substrate 12. Furthermore, a resonant optical cavity may be formed by a pair of DBR mirrors located above and below the active region, thereby producing a resonant-cavity light-emitting diode (RCLED)

10. In this case, one of the DBR mirrors generally is more transmissive to the light than the other DBR mirror for emission of the light in a preferred direction. For an RCLED embodiment of the present invention, the DBR mirrors can be grown epitaxially from III–V compound semiconductor alloys; or one of the DBR mirrors can be epitaxially grown, while the second DBR mirror can be deposited from dielectric materials as known to the art.

For a surface-emitting LED 10 formed according to the present invention, a binary or refractive lens (not shown) may be formed above a surface of the broadband LED 10 for receiving the emitted light and forming the light into a beam, or a focused spot of light (e.g. for directing the light into one or more optical fibers). A binary lens may be formed, for example, by patterning and etching the lower surface of the substrate 12. Alternately a refractive lens of a predetermined size and focal length may be formed by many different means known to the art such as selective etching of the substrate 12; bonding a preformed lens to an upper or lower surface of the LED 10; or depositing and patterning a material such as polyimide or the like on the upper or lower surface of the LED 10 and thermally reflowing the deposited material at an elevated temperature to form a lens.

In FIG. 4, the various emission wavelengths combine to form broadband light emission with a bandwidth (i.e. a full-width at half-maximum intensity) that is up to about 400 nm or more and centered at a predetermined wavelength within the range of about 1.3–2 µm. The intensity profile of the broadband light may be shaped by varying the thickness of one or more of the SQW layers 28 to increase or decrease the emission from that SQW layer. (It may also be necessary to adjust the thicknesses of the barrier layers 30 to control a transport and distribution of the carriers across the different SQW layers 28.) Although the semiconductor alloy composition for the broadband LED 10 of FIG. 4 was varied linearly across the active region 18 during growth, the resulting emission wavelengths, $\lambda_1$, $\lambda_2$ and $\lambda_3$ in this first example are not equally spaced. This is a consequence of the different levels of strain in the SQW layers 28, and the opposite strains of the first-grown and last-grown SQW layers (28a and 28c, respectively). Another method for growing the plurality of semiconductor layers forming the semiconductor structure (and especially the active region 18) is presented hereinafter that allows a more uniformly spaced location of the different emission wavelengths.

Figure 5:
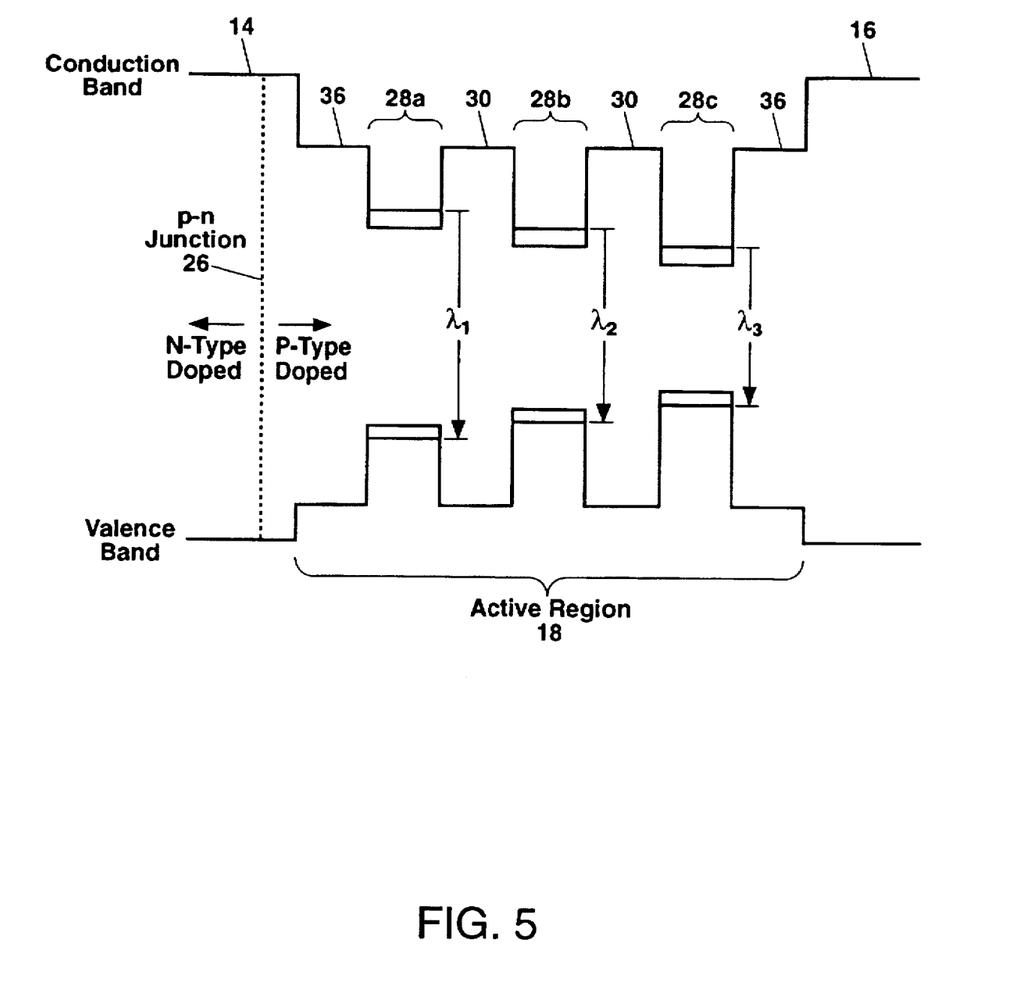
FIG. 5 shows a partial energy band diagram for a second example of a strainedquantum-well active region of a broadband LED formed according to the present invention.

FIG. 5 shows a partial energy band diagram for a second example of a strainedquantum-well active region 18 of the broadband LED 10 according to the present invention. In this second example, the entire active region 18 can be formed by epitaxially growing a plurality of short-period-superlattice layers forming strained-quantum-well layers 28, barrier layers 30, and separate-confinement layers 36 with different average semiconductor alloy compositions. (The term digital alloy is used herein to denote an average semiconductor alloy composition of the layers 28, 30 or 36 formed from a plurality of short-period-superlattice layers having substantially different semiconductor alloy compositions.) An advantage of this second example of the strained-quantum-well active region is that separate-confinement layers 36 may be more easily incorporated into the active region 18 during growth than when using a temperature ramp of one or more effusion cells for altering the composition of the active-region layers as in the first example of FIG. 2. (The growth of self-confinement layers 36 according to the first example generally requires that the MBE growth process be interrupted to reset the effusion cell at the first predetermined temperature for growth of a last-grown separate-confinement layer above the SQW layers 28.) Another advantage of the second example is that the bandgap wavelengths, $\lambda$, of each SQW layer 28 may be more easily located at predetermined wavelengths, while preferably growing all of the SQW layers 28 with the same strain type (i.e. either in compression or in tension).

The second example of a strained-quantum-well active region 18 may be best understood with reference to FIG. 6. FIG. 6 shows an energy bandgap versus lattice constant diagram for a number of different III–V compound semiconductor alloy compositions of interest. These semiconductor alloy compositions can be grown by MBE using single effusion cells for each of In, Ga, Al and As. A flux, f, from each effusion cell can be provided by opening a shutter in front of each effusion cell. During epitaxial growth of the plurality of semiconductor layers, a shutter for the As effusion cell is opened; and shutters for the remaining cells are periodically opened and closed. In the example of FIG. 6, a shorthand vector notation $(f_{In}, f_{Ga}, f_{Al})$ is used to represent a growth state of the MBE apparatus as defined by the presence (indicated by a value of "1") or absence (indicated by a value of "0") of flux, f, from the In, Ga and Al effusion cells. Thus, by defining a plurality of growth states each representing a predetermined semiconductor alloy composition and repetitively switching between those growth states, an active region 18 may be grown in the form of a short-period superlattice. (A short-period superlattice is defined herein as a layered structure formed of alternating thin layers of two different semiconductor alloy compositions, each thin layer in the structure being only a few monolayers thick.) This novel method for epitaxial growth of the active region 18 as a short-period superlattice structure provides an increased flexibility and agility for defining the composition, bandgap energy and other parameters of the SQW, barrier and separate-confinement layers; and the growth method can be applied to many other types of semiconductor structures and devices (e.g. vertical-cavity and edge-emitting semiconductor diode lasers, quantum-cascade semiconductor lasers, resonant-cavity optical modulators and graded-bandgap heterojunction transistors) that require epitaxial growth of multiple III–V compound-semiconductor materials having different bandgaps, refractive indices, strains, etc. This method for growing short-period superlattice structures (also termed pseudo alloys) has been further described in a paper by I. J. Fritz, J. F. Klem, M. J. Hafich, and A. J. Howard entitled "Novel Pseudoalloy Approach to Epitaxial Growth of Complex InGaAlAs Multilayer Structures" published in Applied Physics Letters (volume 66, pages 2825–2827, 22 May 1995) which is incorporated herein by reference.

In FIG. 6, a first growth state (1, 1, 0) represents the growth of a ternary alloy InGaAs (e.g. $In_{0.66}Ga_{0.34}As$) with the shutters of the In, Ga and As effusion cells being opened. (An In:Ga flux ratio can be set to grow a predetermined InGaAs alloy composition when the shutters of the In, Ga and As effusion cells are opened.) Similarly, a second growth state (1, 0, 1) represents growth of a ternary alloy InAlAs (e.g. lattice-matched $In_{0.52}Al_{0.48}As$) with the shutters of the In, Al and As effusion cells being opened and the shutter for the Ga cell being closed. (An In:Al flux ratio is preset to grow a predetermined InAlAs alloy composition.) And, a third growth state (1, 1, 1) with all of the effusion cell shutters opened results in the growth of a quaternary alloy InGaAlAs (e.g. $In_{0.41}Ga_{0.21}Al_{0.38}As$) with the fluxes from the different effusion cells being approximately additive due to a large As overpressure. (Other states shown in FIG. 6 can be used for growing other binary or ternary compounds.)

Thus, according to the present invention, embodiments of a broadband LED 10 can be grown on an InP substrate 12 with all the layers within the active region 18 having any semiconductor alloy compositions that are on or within an enclosed region labelled "A" in FIG. 6 (i.e. the region bounded by the dark lines connecting the first, second and third growth states) by rapidly switching between the various growth states. (For broadband LEDs 10 formed on other types of III–V compound semiconductor substrates such as InGaAs, InAs, GaSb, or AlSb, a plurality of growth states can be provided according to the teaching of the present invention to define semiconductor alloy compositions within a different predetermined enclosed region that can be centered about a lattice constant of the substrate 12.)

As an example, by alternately switching between the first and third growth states in FIG. 6 with a duty cycle, q, an effective alloy compound (also termed a pseudo-quaternary alloy):

$$q(In_{0.41}Ga_{0.21}Al_{0.38}As)+(1-q)(In_{0.66}Ga_{0.34}As)$$

can be formed with a bandgap wavelength varying from 2.0 to 0.9 μm and a lattice misfit with an InP substrate varying from +0.9% to −0.8% as the duty cycle is varied from 0 to 1. This can be achieved very simply by leaving the In, Ga and As shutters open during epitaxial growth, and switching the Al shutter open and shut for predetermined periods of time according to the duty cycle q. It should also be noted that a semiconductor layer of a particular overall thickness formed with a short-period superlattice structure is expected to behave much as a layer of the same thickness but having a semiconductor alloy composition that is equal to a compositional average over the short-period superlattice structure, so that a short-period superlattice structure having an effective alloy $q(1, 1, 1)+(1-q)(1, 1, 0)$ is expected to be functionally equivalent to a layer of the same overall thickness but having a bulk InGaAlAs composition given by a growth state $(1, 1, q)$ located along the $(1, 1, 0)$ to $(1, 1, 1)$ line in FIG. 6. Due to use of a relatively large As overpressure and a low growth temperature of about 500° C. it is a good approximation to assume that the MBE growth rates are additive and determined primarily by the Group III flux rates (i.e. the fluxes of In, Ga and Al).

Figure 7A:
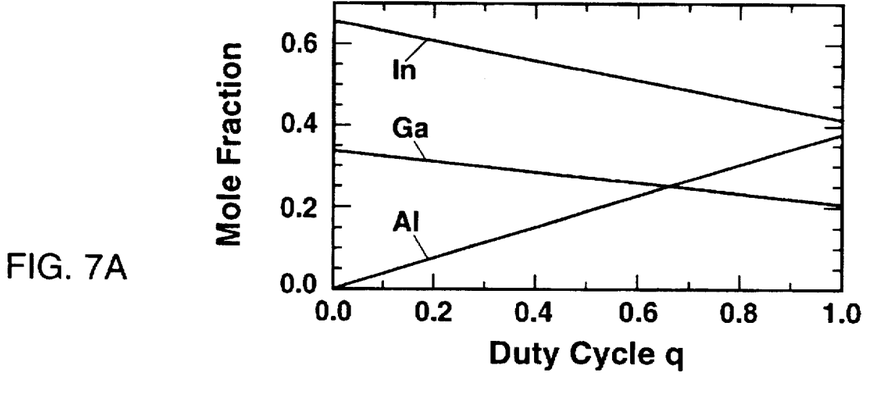
FIGS. 7A, 7B and 7C show the dependence of a mole fraction, a bandgap wavelength, and a percentage of lattice misfit, respectively, on a growth duty cycle, q, for a bulk semiconductor alloy layer for use in estimating parameters of layers within the active region of FIG. 5 having a short-period-superlattice structure.
Figure 7B:
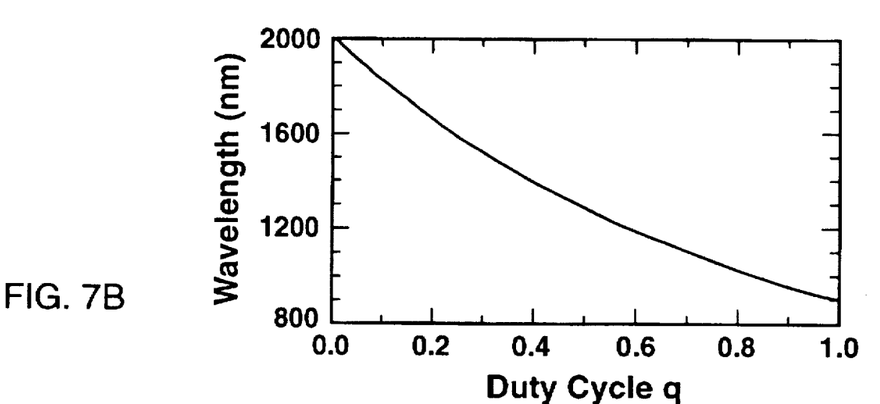
Figure 7C:
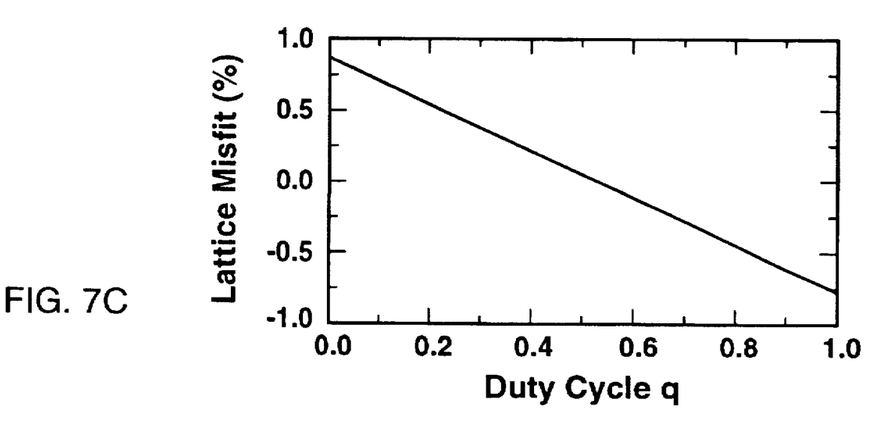

Properties of such an equivalent bulk InGaAlAs layer grown at the state $(1, 1, q)$ are presented in FIG. 7 for use in estimating equivalent characteristics of a short-period superlattice structure of composition $q(1, 1, 1)+(1-q)(1, 1, 0)$. In FIG. 7a, a mole fraction for each of the elements In, Ga and Al in the equivalent bulk InGaAsAs alloy are shown as a function of the duty cycle, q, assuming a homogeneous alloy composition. FIG. 7b shows a bandgap wavelength calculated for the equivalent bulk InGaAlAs alloy layer using a standard interpolation procedure ignoring strain and confinement effects; and FIG. 7c shows the strain in terms of the percentage of lattice misfit, Δa, for the equivalent bulk InGaAlAs alloy layer if grown on an InP substrate.

The second example of a strained-quantum-well active region 18 in FIG. 5 consists of three compressively-strained SQW layers 28 with a first-grown of the SQW layers 28a comprising a short-period superlattice formed with a growth duty cycle q=0; a second-grown of the SQW layers 28b being a short-period superlattice formed with q=0.18; and a third-grown of the SQW layers 28c being a short-period superlattice formed with q=0.36. In this example, each adjacent pair of SQW layers 28 is separated by a tensile-strained barrier layer 30 (e.g. about 6.7 nm thick) formed from a short-period superlattice with q=0.72; and separate-confinement layers 36 (e.g. about 21 nm thick) are grown at either side of the active region 18 from a short-period superlattice with q=0.72. Each of the SQW layers 28 can comprise a short-period superlattice formed by alternately growing about 1.35-nm-thick InGaAs layers (e.g. $In_{0.66}Ga_{0.34}As$) during the first growth state, separated by about 0.29-nm-thick InGaAlAs layers (e.g. $In_{0.41}Ga_{0.21}Al_{0.38}As$) epitaxially grown during the third growth state. For the separate-confinement layers 36, the layer thicknesses were about 0.47 nm for epitaxial growth during the first growth state (e.g. $In_{0.66}Ga_{0.34}As$), and about 1.17 for growth during the third growth state (e.g. $In_{0.41}Ga_{0.21}Al_{0.38}As$). After growth of the plurality of semiconductor layers on an InP substrate 12 according to this second example of the present invention, the layers can be etched to form a mesa 32 as in FIG. 3, with individual devices provided with lateral dimensions of, for example, between 0.2 and 1.8 mm on a side. By cleaving the substrate 12 along a cleave plane adjacent to a sidewall of the mesa 32, both side and top emission of light from the broadband LED 10 can be measured with the spectrometer.

Broadband LEDs 10 grown with all the SQW layers 28 having a uniform layer thickness of about 10 nm showed more light emission from the last-grown SQW layer 28c than from the other SQW layers (28a and 28b). To adjust the emission intensity from the individual SQW layers, other broadband LEDs 10 were fabricated according to the second embodiment of the invention in FIG. 3 with the first-grown SQW layer 28a and the second-grown SQW layer 28b having increased layer thickness of 13 nm and 11.5 nm, respectively. In these latter devices, the 10-nm SQW layer 28c was expected to have two confined exciton energy levels therein (i.e. n=1 and n=2); whereas the thicker SQW layers (28a and 28b) were expected to each have three confined exciton energy levels therein thereby increasing the emission intensity from SQW layers 28a and 28b relative to the emission from SQW layer 28c.

Figure 8:
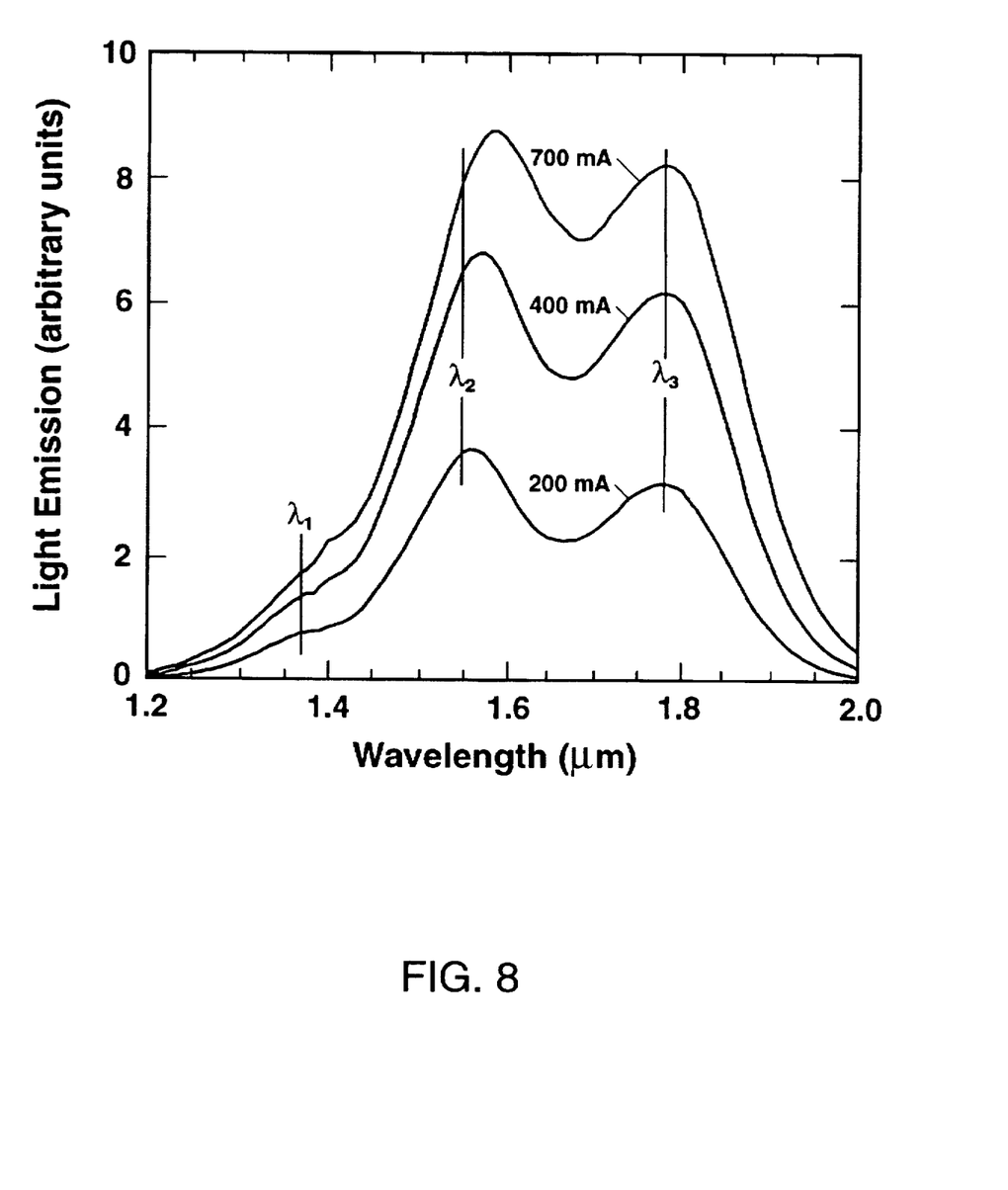
FIG. 8 shows emission spectra for light emitted from a surface-emitting broadband LED having a strained-quantum-well active region formed according to the second example of FIG. 5.

FIG. 8 shows emission spectra at dc injection currents of 200, 400 and 700 mA for light emitted upward from a broadband LED 10 having a strained-quantum-well active region 18 formed according to the second example of FIG. 5 with the emission intensity for the individual SQW layers 28 adjusted as described immediately above. For top-surface emission, both the heavy-hole (HH) and light-hole (LH) transitions are allowed. However, n=1 heavy-hole transitions are expected to dominate the emission spectrum due to a large wavelength shift between the HH and LH transitions arising from compressive strain in each of the SQW layers 28. Vertical lines in FIG. 8 are provided to show calculated bandgap wavelengths, λ, for the heavy-hole transitions in each of the SQW layers 28, with the bandgap wavelengths being more evenly spaced than for the first example of the strained-quantum-well active region 18. The calculated bandgap wavelengths at about 1.38 μm, 1.58 μm and 1.78 μm are in general agreement with features in the emission spectra.

In FIG. 8, the light emission from the first- and second-grown SQW layers (28a and 28b, respectively) is significantly increased relative to other broadband LEDs 10 having equal-thickness SQW layers 28, although the emission from the first-grown SQW layer 28a near 1.4 μm is still relatively weak. At 700 mA current, the emission bandwidth (full width at half maximum) is about 400 nm with a spatial profile for the emission that is approximately cosinusoidal about an axis normal to the layers of the semiconductor structure and centered about the aperture 34. For this broadband LED 10, useful light emission is obtained over a wavelength range of about 1.3–1.9 μm.

An enhancement of the emission intensity from the second-grown SQW layer 28b results in a more uniform spectral profile than that of the first example of a broadband LED 10 in FIG. 4. Further improvements in the emission intensity from the first-grown SQW layer 28a are expected if the layer thickness of SQW layer 28a (and possibly the barrier layers 30) are further adjusted according to the teaching of the present invention.

The matter set forth in the foregoing description and accompanying drawings is offered by way of illustration only and not as a limitation. Other applications and variations of the broadband light-emitting diode will become evident to those skilled in the art. The actual scope of the invention is intended to be defined in the following claims when viewed in their proper perspective based on the prior art.

What is claimed is:

1. A broadband light-emitting diode (LED) comprising:
   (a) a plurality of III–V compound-semiconductor layers grown on a substrate, the semiconductor layers including a pair of cladding layers sandwiched about a strained-quantum-well active region having a plurality of different energy bandgaps; and
   (b) electrodes formed above and below the strained-quantum-well active region for electrically activating the LED and generating light within a wavelength range of about 1.3–2 µm.

2. The broadband LED of claim 1 wherein one of the cladding layers includes a semiconductor p-n junction formed therein.

3. The broadband LED of claim 1 wherein the substrate comprises a III–V compound semiconductor material selected from the group consisting of InP, InAs, GaSb, AlSb, and InGaAs.

4. The broadband LED of claim 1 wherein the strained-quantum-well active region comprises a substantially lattice-matched quantum-well layer located between a pair of oppositely strained quantum-well layers, with the quantum-well layers further being separated by barrier layers.

5. The broadband LED of claim 1 wherein the strained-quantum-well active region comprises a plurality of strained quantum-well layers separated by barrier layers, with each quantum-well layer having a different energy bandgap and a different amount of strain therein.

6. The broadband LED of claim 5 wherein each strained quantum-well layer has about the same thickness.

7. The broadband LED of claim 5 wherein each strained quantum-well layer has a thickness in the range of about 5–20 nm.

8. The broadband LED of claim 5 wherein at least one of the strained quantum-well layers has a thickness different from the remaining quantum-well layers for increasing the emission of light therefrom.

9. The broadband LED of claim 5 wherein a first-grown quantum-well layer and a last-grown quantum-well layer are oppositely strained.

10. The broadband LED of claim 5 wherein each strained quantum-well layer comprises at least in part InGaAs.

11. The broadband LED of claim 5 wherein at least one of the strained quantum-well layers comprises a short-period superlattice formed of alternating layers of InGaAs and InGaAlAs of predetermined thicknesses.

12. The broadband LED of claim 11 wherein the predetermined thicknesses of the InGaAs and InGaAlAs define at least in part the energy bandgap of the strained quantum-well layer.

13. The broadband LED of claim 11 wherein the active region is substantially strain compensated with the quantum-well layers and the barrier layers being oppositely strained.

14. The broadband LED of claim 11 wherein the strained quantum-well active region further includes a separate-confinement layer on each side thereof.

15. The broadband LED of claim 1 wherein light is emitted through at least one of the cladding layers in an upward or downward direction.

16. The broadband LED of claim 1 wherein at least one of the electrodes includes an aperture therethrough for emitting the light.

17. The broadband LED of claim 3 wherein the substrate is transparent and the light is emitted downward through the substrate.

18. The broadband LED of claim 1 wherein light is emitted through a sidewall of the plurality of semiconductor layers.

19. The broadband LED of claim 1 further including a mesa formed in the plurality of semiconductor layers for defining an active area of the active region for light generation therein.

20. The broadband LED of claim 1 wherein the substrate is InP, and all the layers forming the active region have semiconductor alloy compositions within an enclosed region labelled "A" in a bandgap energy versus lattice constant diagram of FIG. 6 that is bounded by a first growth state (1, 1, 0) wherein the alloy composition is InGaAs, a second growth state (1, 0, 1) wherein the alloy composition is InAlAs, and a third growth state wherein the alloy composition is InGaAlAs.

21. The broadband LED of claim 20 wherein the InGaAs alloy composition is approximately $In_{0.66}Ga_{0.34}As$, and the InAlAs alloy composition is approximately $In_{0.52}Al_{0.48}As$.

22. The broadband LED of claim 21 wherein the InGaAlAs alloy composition is approximately $In_{0.41}Ga_{0.21}Al_{0.38}As$.

23. A broadband light-emitting diode (LED) comprising:
   (a) a semiconductor structure including a plurality of III–V compound semiconductor layers, the semiconductor layers including a pair of cladding layers sandwiched about a strained quantum-well active region having a plurality of different energy bandgaps for emitting light at different wavelengths within a range of about 1.3–2 µm;
   (b) a mesa formed within the plurality of semiconductor layers for defining an active area of the active region wherein the light is generated; and
   (c) an electrode formed above the semiconductor structure for electrically activating the LED.

24. The broadband LED of claim 23 wherein one of the cladding layers includes a semiconductor p-n junction formed therein.

25. The broadband LED of claim 23 wherein the active region comprises at least in part InGaAs.

26. The broadband LED of claim 23 wherein light is emitted in an upward or downward direction forming a surface-emitting LED.

27. The broadband LED of claim 23 wherein light is emitted in a direction parallel to the plurality of layers or at an acute angle thereto forming an edge-emitting LED.

28. The broadband LED of claim 23 wherein the strained-quantum-well active region comprises a plurality of strained quantum-well layers separated by barrier layers, with each quantum-well layer having a different energy bandgap and a different amount of strain therein.

29. The broadband LED of claim 28 wherein a first-grown strained-quantum-well layer and a last-grown strained-quantum-well layer are oppositely strained.

30. The broadband LED of claim 28 wherein at least one of the strained-quantum-well layers has a thickness different from the remaining quantum-well layers for increasing the emission of light therefrom.

31. The broadband LED of claim 28 wherein the active region further includes a separate-confinement layer on each side thereof.

32. The broadband LED of claim 28 wherein at least one of the strained-quantum-well layers comprises a short-period superlattice formed of alternating layers of InGaAs and InGaAlAs of predetermined thicknesses.

33. The broadband LED of claim 32 wherein the active region is substantially strain compensated with the quantum-well layers and the barrier layers being oppositely strained.

34. The broadband LED of claim 23 further including a semiconductor substrate for supporting the semiconductor structure.

35. The broadband LED of claim 34 wherein the substrate comprises a III–V compound semiconductor material selected from the group consisting of InP, InAs, GaSb, AlSb, and InGaAs.

36. The broadband LED of claim 34 further including another electrode formed below the semiconductor structure and in contact with a surface of the substrate.

37. A broadband light-emitting diode (LED) for generating light in a wavelength range from about 1.3 μm to about 2 μm comprising:

(a) a semiconductor structure including a plurality of III–V compound semiconductor layers, with the semiconductor layers including an active region having a plurality of strained quantum-well layers therein separated by barrier layers, each quantum-well layer having a different energy bandgap and a different amount of strain for generating light at a different wavelength; and (b) electrodes above and below the semiconductor structure for directing a flow of an electrical current through the active region to generate the light therein.

38. The broadband LED of claim 37 further including a mesa formed in the plurality of semiconductor layers for defining an active area of the active region for light generation therein.

39. The broadband LED of claim 37 wherein at least one of the strained-quantum-well layers has a thickness different from the remaining strained-quantum-well layers for increasing the emission of light therefrom.

40. The broadband LED of claim 37 wherein each strained-quantum-well layer comprises at least in part InGaAs.

41. The broadband LED of claim 37 wherein at least one of the strained-quantum-well layers is formed from a short-period superlattice structure of alternating layers of InGaAs and InGaALAs of predetermined thicknesses.

42. The broadband LED of claim 37 wherein the active region is substantially strain compensated with the quantum-well layers and the barrier layers being oppositely strained.

43. The broadband LED of claim 37 wherein the active-region further includes a separate-confinement layer on each side thereof.

44. The broadband LED of claim 37 wherein the light is emitted in an upward or downward direction.

45. The broadband LED of claim 37 wherein the light is emitted in a direction substantially parallel to the plurality of semiconductor layers.

46. The broadband LED of claim 37 further including a semiconductor substrate for supporting the semiconductor structure.

47. The broadband LED of claim 46 wherein the substrate comprises a III–V compound-semiconductor material selected from the group consisting of InP, InAs, GaSb, AlSb and InGaAs.

48. A broadband light-emitting diode (LED) for generating light in a wavelength range from about 1.3 μm to about 2 μm comprising:

(a) a semiconductor structure including a plurality of III–V compound semiconductor layers, with the semiconductor layers further including an active region having a plurality of strained-quantum-well (SQW) layers therein separated by barrier layers, a first-grown SQW layer of the active region being strained oppositely from a last-grown SQW layer therein; and (b) electrodes above and below the semiconductor structure for directing a flow of an electrical current through the active region to generate the light therein.

49. The broadband LED of claim 48 wherein the light is emitted in a direction substantially perpendicular to the plurality of semiconductor layers.

50. The broadband LED of claim 48 wherein each strained quantum-well layer comprises at least in part InGaAs.

51. The broadband LED of claim 48 wherein the active region further includes a separate-confinement layer on each side thereof.

52. The broadband LED of claim 48 further including a mesa formed in the plurality of semiconductor layers for defining an area for light generation therein.

53. The broadband LED of claim 48 further including a semiconductor substrate for supporting the semiconductor structure, with the substrate comprising a III–V compound semiconductor material selected from the group consisting of InP, InAs, GaSb, AlSb and InGaAs.

* * * * *